(12) United States Patent
Shen

(10) Patent No.: US 11,003,300 B1
(45) Date of Patent: May 11, 2021

(54) PARTIAL GUARDING FOR A SENSING DEVICE

(71) Applicant: SYNAPTICS INCORPORATED, San Jose, CA (US)

(72) Inventor: Guozhong Shen, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/830,147

(22) Filed: Mar. 25, 2020

(51) Int. Cl.
*G06F 3/044* (2006.01)
*H01L 51/52* (2006.01)

(52) U.S. Cl.
CPC .......... *G06F 3/0446* (2019.05); *G06F 3/0443* (2019.05); *H01L 51/5253* (2013.01)

(58) Field of Classification Search
USPC .................................................. 345/170–178
See application file for complete search history.

(56) References Cited

U.S. PATENT DOCUMENTS

| | | | |
|---|---|---|---|
| 2015/0091843 A1* | 4/2015 | Ludden | G06F 3/0412 345/174 |
| 2015/0193082 A1* | 7/2015 | Ludden | G06F 3/0443 345/174 |
| 2017/0090615 A1* | 3/2017 | Bohannon | G06F 3/0446 |

\* cited by examiner

*Primary Examiner* — Tony O Davis
(74) *Attorney, Agent, or Firm* — Leydig, Voit & Mayer, Ltd.

(57) ABSTRACT

A system and method for operating sensor electrodes comprises driving, during a first period, a first portion of the sensor electrodes with a sensing signal. A second portion of the sensor electrodes is driven with a guarding signal during the first period. The second portion is adjacent to the first portion. The guarding signal and the sensing signal have at least one characteristic in common that is selected from a group consisting of amplitude, phase, and frequency. A third portion of the sensor electrodes is electrically floated or driven with a direct current signal during the first period. The third portion is adjacent to the second portion but not adjacent to the first portion.

20 Claims, 8 Drawing Sheets

| Row | First Period | Second Period | Third Period |
|---|---|---|---|
| 170 | Ref. Voltage/Electrically Floated | Ref. Voltage/Electrically Floated | Ref. Voltage/Electrically Floated |
| 171 | Ref. Voltage/Electrically Floated | Ref. Voltage/Electrically Floated | Ref. Voltage/Electrically Floated |
| 172 | Ref. Voltage/Electrically Floated | Ref. Voltage/Electrically Floated | Ref. Voltage/Electrically Floated |
| 173 | Ref. Voltage/Electrically Floated | Ref. Voltage/Electrically Floated | Ref. Voltage/Electrically Floated |
| 174 | Guarded | Ref. Voltage/Electrically Floated | Ref. Voltage/Electrically Floated |
| 175 | Absolute Capacitive Sensing | Ref. Voltage/Electrically Floated | Ref. Voltage/Electrically Floated |
| 176 | Absolute Capacitive Sensing | Guarded | Ref. Voltage/Electrically Floated |
| 177 | Guarded | Absolute Capacitive Sensing | Ref. Voltage/Electrically Floated |
| 178 | Ref. Voltage/Electrically Floated | Absolute Capacitive Sensing | Guarded |
| 179 | Ref. Voltage/Electrically Floated | Guarded | Absolute Capacitive Sensing |
| 180 | Ref. Voltage/Electrically Floated | Ref. Voltage/Electrically Floated | Absolute Capacitive Sensing |
| 181 | Ref. Voltage/Electrically Floated | Ref. Voltage/Electrically Floated | Guarded |

Figure 5

| Row | First Period | Second Period | Third Period | Fourth Period |
|---|---|---|---|---|
| 170 | Absolute Capacitive Sensing | Ref. Voltage /Electrically Floated | Ref. Voltage /Electrically Floated | Ref. Voltage /Electrically Floated |
| 171 | Absolute Capacitive Sensing | Guarded | Ref. Voltage /Electrically Floated | Ref. Voltage /Electrically Floated |
| 172 | Absolute Capacitive Sensing | Guarded | Ref. Voltage /Electrically Floated | Ref. Voltage /Electrically Floated |
| 173 | Guarded | Absolute Capacitive Sensing | Ref. Voltage /Electrically Floated | Ref. Voltage /Electrically Floated |
| 174 | Guarded | Absolute Capacitive Sensing | Guarded | Ref. Voltage /Electrically Floated |
| 175 | Ref. Voltage /Electrically Floated | Absolute Capacitive Sensing | Guarded | Ref. Voltage /Electrically Floated |
| 176 | Ref. Voltage /Electrically Floated | Guarded | Absolute Capacitive Sensing | Ref. Voltage /Electrically Floated |
| 177 | Ref. Voltage /Electrically Floated | Guarded | Absolute Capacitive Sensing | Guarded |
| 178 | Ref. Voltage /Electrically Floated | Ref. Voltage /Electrically Floated | Absolute Capacitive Sensing | Guarded |
| 179 | Ref. Voltage /Electrically Floated | Ref. Voltage /Electrically Floated | Guarded | Absolute Capacitive Sensing |
| 180 | Ref. Voltage /Electrically Floated | Ref. Voltage /Electrically Floated | Guarded | Absolute Capacitive Sensing |
| 181 | Ref. Voltage /Electrically Floated | Ref. Voltage /Electrically Floated | Ref. Voltage /Electrically Floated | Absolute Capacitive Sensing |

Figure 7

PARTIAL GUARDING FOR A SENSING DEVICE

BACKGROUND

Field

The disclosure herein is generally related to electronic devices, and more specifically, to reducing the effects of interference within a sensing device.

Description of the Related Art

Input devices including proximity sensor devices may be used in a variety of electronic systems. A proximity sensor device may include a sensing region, demarked by a surface, in which the proximity sensor device determines the presence, location, force and/or motion of one or more input objects. Proximity sensor devices may be used to provide interfaces for the electronic system. For example, proximity sensor devices may be used as input devices for larger computing systems, such as touchpads integrated in, or peripheral to, notebook computers, desktop computers, automotive multimedia systems, or internet of things (IoT) devices. Proximity sensor devices may also often be used in smaller computing systems, such as touch screens integrated in cellular phones.

SUMMARY

In one embodiment, a method for operating sensor electrodes comprises driving, during a first period, a first portion of the sensor electrodes with a sensing signal. A second portion of the sensor electrodes is driven with a guarding signal during the first period. The second portion is disposed adjacent to the first portion. The guarding signal and the sensing signal have at least one characteristic in common that is selected from a group consisting of amplitude, phase and frequency. A third portion of the sensor electrodes is electrically floating or driven with a direct current (DC) signal during the first period. The third portion adjacent to the second portion but not adjacent to the first portion.

In one embodiment, a processing system comprises sensor circuitry coupled to sensor electrodes. The sensor circuitry is configured to drive, during a first period, a first portion of the sensor electrodes with a sensing signal and drive a second portion of the sensor electrodes with a guarding signal. The second portion is adjacent to the first portion. The guarding signal and the sensing signal have at least one characteristic in common selected from a group consisting of an amplitude, phase, and frequency. The sensor circuitry electrically floats or drives a third portion of the sensor electrodes with a DC signal during the first period. The third portion is adjacent to the second portion but not adjacent to the first portion.

In one embodiment, an input device comprises sensor electrodes, and a processing system coupled to the sensor electrodes. The processing system is configured to drive a first portion of the sensor electrodes with a sensing signal during and a second portion of the sensor electrodes with a guarding signal during the a first period. The second portion is adjacent to the first portion. The guarding signal and the sensing signal have at least one characteristic in common selected from a group consisting of an amplitude, phase, and frequency. The processing system is configured to electrically float or drive a third portion of the sensor electrodes with a DC signal during the first period. The third portion is adjacent to the second portion but not adjacent to the first portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 5 is a timing diagram of a capacitive frame, according to one or more embodiments.

FIG. 7 is a timing diagram of a capacitive frame, according to one or more embodiments.

Figure 1:
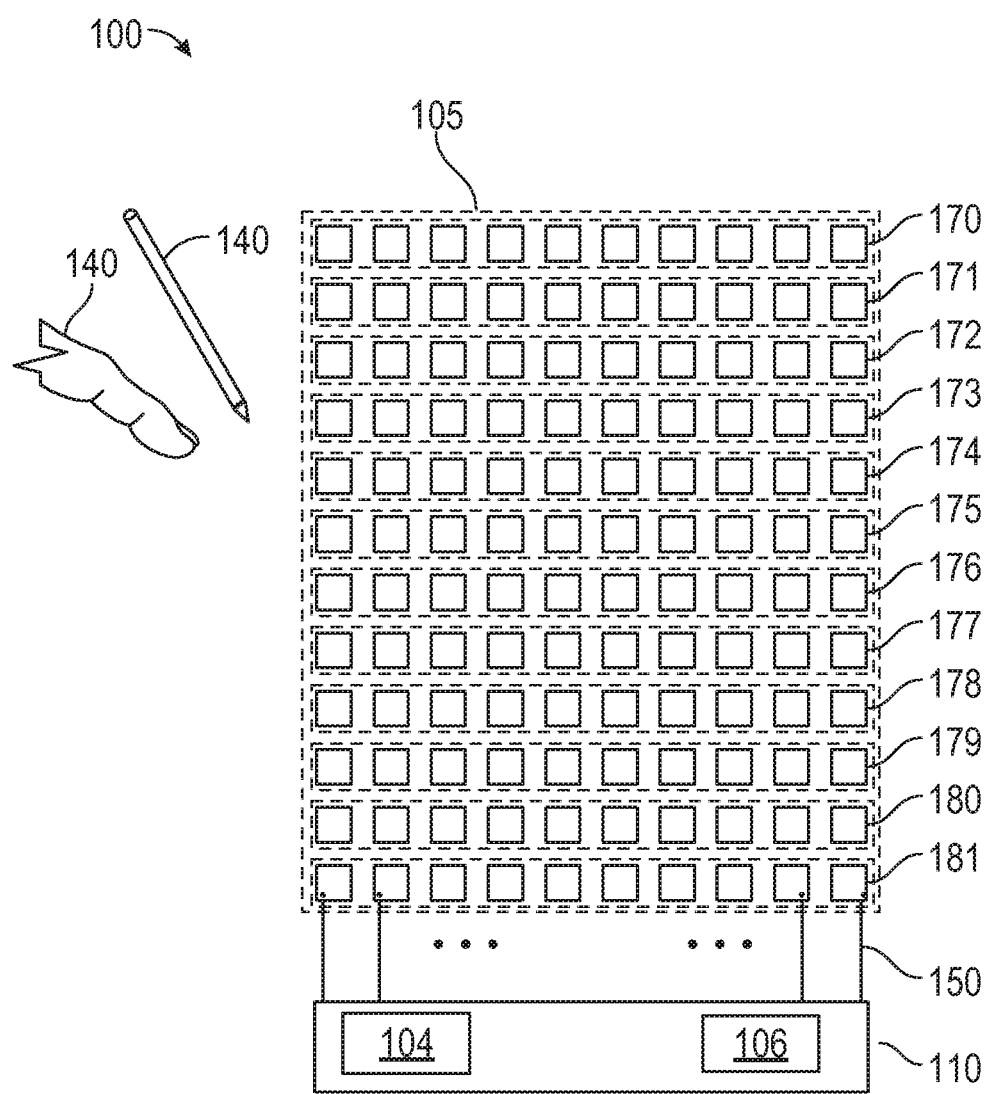
FIG. 1 is a schematic block diagram of an input device, according to one or more embodiments.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

In many input devices, sensor electrodes are disposed proximate a display device. In such input devices, the display electrodes of the display device are capacitively coupled with the sensor electrodes. Accordingly, the capacitance of the sensor electrodes is increased, increasing the power required to operate the sensor electrodes for capacitive sensing. However, by operating a first portion of the sensor electrodes for capacitive sensing and driving a second portion of the sensor electrodes with a guarding signal, the capacitive coupling between the sensor electrodes and the display electrodes is reduced, advantageously reducing the power required to operate the sensor electrode for capacitive sensing.

FIG. 1 illustrates input device 100 configured to reduce capacitive coupling between sensor electrodes and display electrodes. The input device 100 may be configured to provide input to an electronic system (not shown). Some non-limiting examples of electronic systems include desktop computers, laptop computers, netbook computers, tablets, terminals, kiosks, cellular phones, automotive multimedia centers and internet of things (IoT) devices, among others.

The input device 100 includes a processing system 110 and sensor electrodes 105. The processing system 110 operates the sensor electrodes 105 to detect one or more input objects 140 in a sensing region of the input device 100. Example input objects 140 include fingers and styli, as shown in FIG. 1.

The sensing region of the input device 100 encompasses any space above, around, in and/or near the input device 100 in which the input device 100 is able to detect user input, e.g., user input provided by one or more input objects 140.

The sensor electrodes 105 are coupled to the processing system 110 via traces 150. The exemplary pattern of the sensor electrodes 105 illustrated in FIG. 1 comprises an array of sensor electrodes 105 disposed in a plurality of rows and columns. In one example, the sensor electrodes 105 are disposed in rows 170-181. It is contemplated that the sensor electrodes 105 may be arranged in other patterns, such as polar arrays, repeating patterns, non-repeating patterns, non-uniform arrays, or other suitable arrangement. The sensor electrodes 105 may have a shape that is circular, rectangular, diamond, star, square, nonconvex, convex, nonconcave concave, or other suitable geometry.

The sensor electrodes 105 may be disposed in a common layer. For example, the sensor electrodes 105 may be disposed on a first side of a common substrate. In other embodiments, the sensor electrodes 105 may be disposed in two or more layers. For example, a portion of the sensor electrodes 105 may be disposed on a first layer and another portion of the sensor electrodes may be disposed on a second layer. The first and second layers may be disposed on different sides of a common substrate, or disposed on different substrates.

The sensor electrodes 105 may be comprised of a conductive material such as a metal mesh, indium tin oxide (ITO), or the like. Further, the sensor electrodes 105 are ohmically isolated from each other. That is, one or more insulators separate the sensor electrodes and prevent them from electrically shorting to each other.

The processing system 110 includes sensor circuitry 104. Further, the processing system 110 may include a determination module 106. The processing system 110 is configured to operate the sensor electrodes 105 to detect one or more input objects 140 in the sensing region of the input device 100. The processing system 110 fully or partially resides in one or more integrated circuit (IC) chips. For example, the processing system 110 may include a single IC chip. Alternatively, the processing system 110 includes multiple IC chips.

The sensor circuitry 104 is coupled to the sensor electrodes 105 via the routing traces 150 and is configured to drive the sensor electrodes 105 with sensing signals to detect one or more input objects 140 in the sensing region of the input device 100.

The sensor circuitry 104 includes digital and/or analog circuitry. For example, the sensor circuitry 104 comprises transmitter (or driver) circuitry configured to drive sensing signals onto the sensor electrodes 105 and receiver circuitry to receive resulting signals from the sensor electrodes 105. The transmitter circuitry may include one or more amplifiers and/or one or more modulators configured to drive sensing signals on to the sensor electrodes 105. The receiver circuitry may include analog front ends (AFEs) comprising integrators configured to receive resulting signals from the sensor electrodes 105.

In one embodiment, the sensor circuitry 104 drives a first one or more of the sensor electrodes 105 with a transcapacitive sensing signal and receives a resulting signal with a second one or more of the sensor electrodes 105 to operate the sensor electrodes 105 for transcapacitive sensing. Operating the sensor electrodes 105 for transcapacitive sensing detects changes in capacitive coupling between sensor electrodes driven with a transcapacitive sensing signal and sensor electrodes operated as receiver electrodes. The capacitive coupling may be reduced when an input object (e.g., the input object 140) coupled to a system ground approaches the sensor electrodes. Driving the sensor electrodes 105 with transcapacitive sensing signals comprises modulating the sensor electrodes 105 relative to a reference voltage, e.g., system ground.

The transcapacitive sensing signal is a periodic or aperiodic signal that varies between two or more voltages. Further, the transcapacitive sensing signal has a frequency between 100 kHz and 1 MHz. In other embodiments, other frequencies may be utilized. The transcapacitive sensing signal may have a peak to peak amplitude in a range of about 1 V to about 10 V. However, in other embodiments, the transcapacitive sensing signal may have a peak to peak amplitude greater than about 10 V. Additionally, the transcapacitive sensing signal may have a square waveform, a sinusoidal waveform, triangular waveform, a trapezoidal waveform, or a sawtooth waveform, among others.

In some embodiments, operating the sensor electrodes 105 to receive resulting signals comprises holding the sensor electrodes 105 at a substantially constant voltage or modulating the sensor electrodes 105 relative to the transcapacitive sensing signal. A resulting signal includes effect(s) corresponding to one or more transcapacitive sensing signals, and/or to one or more sources of environmental interference, e.g., other electromagnetic signals.

In one embodiment, the sensor circuitry 104 operates the sensor electrodes 105 for absolute capacitive sensing by driving a first one or more of the sensor electrodes 105 with an absolute capacitive sensing signal and receiving a resulting signal with the driven sensor electrodes. Operating the sensor electrodes 105 for absolute capacitive sensing detects changes in capacitive coupling between sensor electrodes driven with an absolute capacitive sensing signal and an input object (e.g., the input object 140). The capacitive coupling of the sensor electrodes 105 driven with the absolute capacitive sensing signal is altered when an input object (e.g., the input object 140) coupled to a system ground approaches the sensor electrodes.

The absolute capacitive sensing signal is a periodic or aperiodic signal that varies between two or more voltages. Further, the absolute capacitive sensing signal has a frequency between 100 kHz and 1 MHz. In other embodiments, other frequencies may be utilized. Additionally, the absolute capacitive sensing signal may have a square waveform, a sinusoidal waveform, triangular waveform, a trapezoidal waveform, or a sawtooth waveform, among others. The absolute capacitive sensing signal may have a peak to peak amplitude in a range of about 1 V to about 10 V. However, in other embodiments, the absolute capacitive sensing signal may have a peak to peak amplitude greater than about 10 V. In various embodiments, driving the sensor electrodes 105 with an absolute capacitive sensing signal comprises modulating the sensor electrodes 105. A resulting signal received while performing absolute capacitive sensing may comprise effect(s) corresponding to one or more absolute capacitive sensing signals, and/or to one or more sources of environmental interference, e.g., other electromagnetic signals. The absolute capacitive sensing signal may be the same as or different from the transcapacitive sensing signal used in transcapacitance sensing.

The sensor circuitry 104 operates a first portion of the sensor electrodes 105 for absolute capacitive sensing. The first portion of the sensor electrodes 105 corresponds to one or more sensor electrodes 105. The first portion of the sensor electrodes 105 corresponds to a first subset of the sensor electrodes 105. In one embodiment, the first portion of the sensor electrodes 105 corresponds to one or more of the rows 170-181. The first portion of the sensor electrodes may correspond to two or more of the rows 170-181.

The sensor circuitry 104 may simultaneously operate two or more of the sensor electrodes 105 for absolute capacitive sensing. For example, the sensor circuitry 104 simultaneously operates each sensor electrode 105 of a first portion of the sensor electrodes 105 for absolute capacitive sensing. The sensor circuitry 104 may simultaneously operate each sensor electrode 105 of a common row (e.g., rows 170-181) for absolute capacitive sensing. Further, the sensor circuitry 104 may simultaneously operate each sensor electrode 105 of two or more rows (e.g., two or more of rows 170-181) for absolute capacitive sensing.

The sensor circuitry 104 drives a second portion of the sensor electrodes 105 with a guarding signal. The second portion of the sensor electrodes 105 corresponds to one or more of the sensor electrodes 105. The second portion of the sensor electrodes 105 corresponds to a second subset of the sensor electrodes 105. In one embodiment, the second portion of the sensor electrodes 105 corresponds to two or more of the sensor electrodes 105. The second portion of the sensor electrodes 105 corresponds to one or more of the rows 170-181. In one embodiment, the second portion of the sensor electrodes 105 corresponds to two or more rows 170-181. The second portion of the sensor electrodes 105 corresponds to more sensor electrodes than the first portion of the sensor electrodes 105. Alternatively, the second portion of the sensor electrodes 105 correspond to less sensor electrodes than the first portion of the sensor electrodes 105. In one embodiment, the first and second portions of the sensor electrodes 105 corresponds to the same number of sensor electrodes.

The sensor circuitry simultaneously drives the sensor electrodes of one or more rows (e.g., rows 170-181) of the sensor electrodes 105 with a guarding signal. Simultaneously driving the sensor electrodes of one or more rows (e.g., rows 170-181) of the sensor electrodes 105 with the guarding signal comprises driving each sensor electrode 105 of one or more rows (e.g., rows 170-181) of the sensor electrodes 105 with the guarding signal.

A sensor electrode driven with a guarding signal may be referred to as a guarded sensor electrode. Driving a sensor electrode with a guarding signal mitigates a voltage difference between the guarded sensor electrode and a sensor electrode driven with the absolute capacitive sensing signal in parallel. Accordingly, by driving the guarding signal onto a first one or more sensor electrodes while driving the sensing signal onto a second one or more sensor electrodes there is little or no change in capacitance between the guarded sensor electrode(s) and the sensor electrode(s) driven with the absolute capacitive sensing signal.

The guarding signal has at least once characteristic selected from a group consisting of amplitude, a phase, and a frequency in common with the absolute capacitive sensing signal. In one embodiment, the guarding signal and the absolute sensing signal have a common amplitude, phase, and frequency. In one embodiment, one of an amplitude, phase, and frequency of the guarding signal is in common with the absolute capacitive sensing signal. In another embodiment, the guarding signal comprises an amplitude and phase or frequency in common with the absolute capacitive sensing signal. In one embodiment, the guarding signal comprises a phase and amplitude or frequency in common with the absolute capacitive sensing signal. Alternatively, the guarding signal comprises a frequency and amplitude or phase in common with the absolute capacitive sensing signal.

Additionally, the guarding signal and the absolute capacitive sensing signal may have a common waveform shape. In one embodiment, the guarding signal may be the same as the absolute capacitive sensing signal.

The sensor circuitry 104 drives a third portion of the sensor electrodes 105 with a reference signal. The third portion of the sensor electrodes 105 corresponds to a third subset of the sensor electrodes 105. The sensor circuitry 104 may drive one or more rows (e.g., rows 170-181) of the sensor electrodes 105 with a reference signal. Driving one or more rows (e.g., rows 170-181) of the sensor electrodes 105 with a reference signal comprises sequentially driving each sensor electrode 105 of one or more rows (e.g., rows 170-181) of the sensor electrodes 105 with the reference signal. The reference signal may be a direct current (DC) signal. In one embodiment, the reference signal is a ground signal of the input device 100.

The sensor circuitry 104 electrically floats the third portion of the sensor electrodes 105. In one embodiment, the sensor circuitry 104 electrically floats one or more of the sensor electrodes 105. Electrically floated sensor electrodes are not actively driven by the sensor circuitry 104. For example, the sensor circuitry 104 may be decoupled from the one or more sensor electrodes 105 to electrically float the one or more sensor electrodes. Further, the sensor circuitry 104 may maintain the sensor electrodes in a high impedance state to electrically float the one or more sensor electrodes.

The third portion of the sensor electrodes 105 corresponds to more sensor electrodes than the first portion and/or the second portion of the sensor electrodes 105. Alternatively, the third portion of the sensor electrodes 105 correspond to less sensor electrodes than the first portion and/or the second portion of the sensor electrodes 105. In one embodiment, the first, second, and third portions of the sensor electrodes 105 corresponds to the same number of sensor electrodes.

The determination module 106 receives the resulting signals from the sensor circuitry 104 and processes the resulting signals to determine changes in capacitive coupling of the sensor electrodes 105. The determination module 106 utilizes the changes in capacitive coupling of the sensor electrodes 105 to determine positional information of one or more input objects (e.g., the input object 140).

In one or more embodiments, measurements of the changes in capacitive coupling determined from the resulting signals received from the sensor electrodes 105 may be utilized by the determination module 106 to form a capacitive image. The resulting signals utilized to detect the changes in capacitive coupling are received during a capacitive frame. A capacitive frame may correspond to one or more capacitive images. Multiple capacitive images may be acquired over multiple time periods, and differences between the images used to derive information about an input object 140 in the sensing region of the input device 100. For example, successive capacitive images acquired over successive periods of time can be used to track the motion(s) of one or more input objects entering, exiting, and within the sensing region.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

Figure 2:
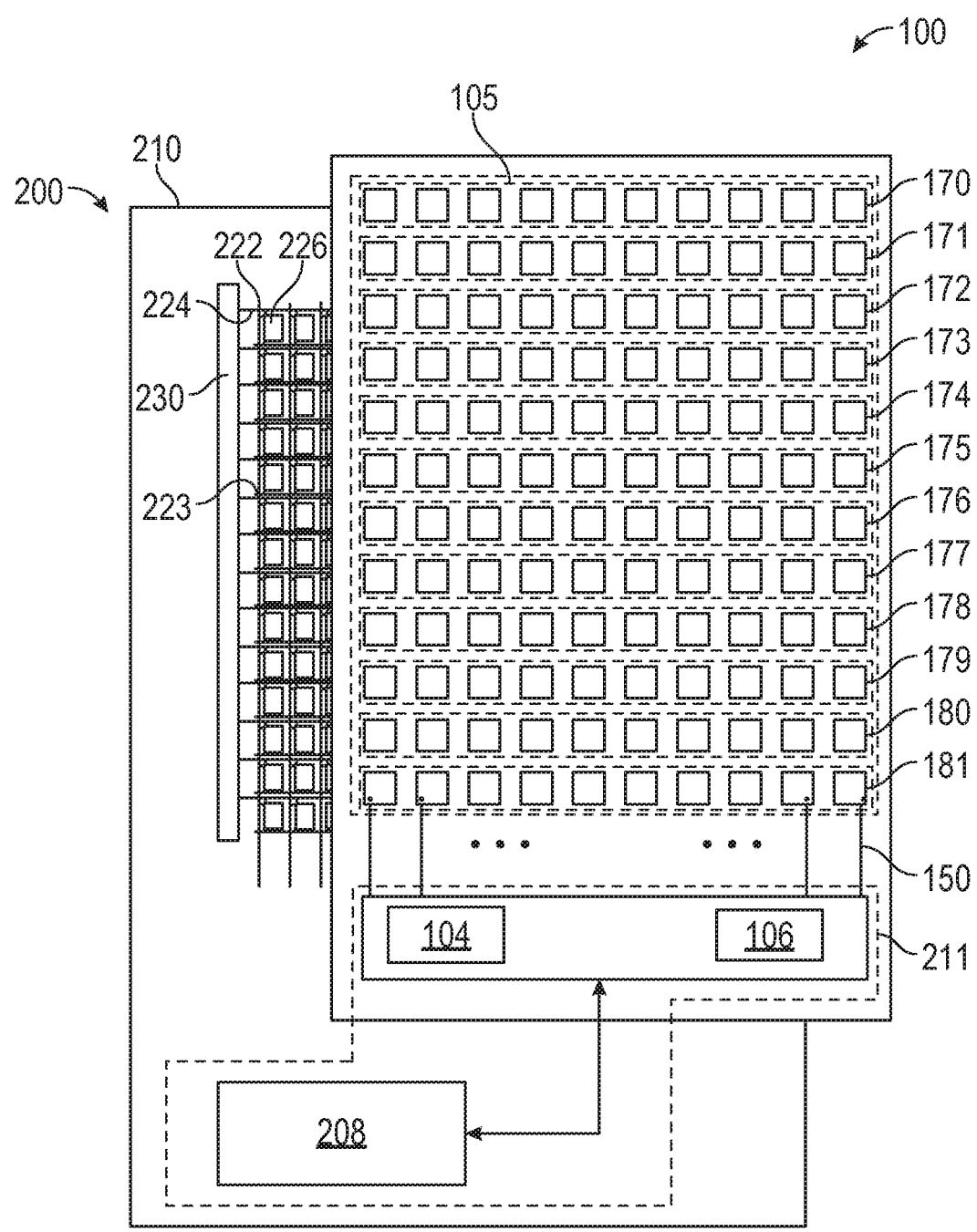
FIG. 2 is a schematic block diagram of an input device and display device, according to one or more embodiments.

In some embodiments, the input device 100 is a touch screen interface that overlaps at least part of a display of a display device. For example as illustrated in FIG. 2, the input device 100 is shown overlapped with a display of a display device 200. The display device 200 includes a display panel 210 communicatively coupled with a display driver 208 and gate selection circuitry 230. The display panel 210 includes display electrodes that are driven to update subpixel electrodes 226 of the display panel 210. The display electrodes include data lines 222, gate lines 224, and/or emission control lines 223, among others.

The data lines 222 are coupled to the display driver 208 and the gate lines 224 are coupled to the gate selection circuitry 230. Further, the emission control lines 223 are coupled to emission control circuitry. Each of the subpixel electrodes 226 is coupled to one of the gate lines 224 and one of the data lines 222. Further, in one or more embodiments each of the subpixel electrodes 226 is coupled to an emission control line 223.

The gate selection circuitry 230 is configured to drive gate select and gate deselect signals onto the gate lines 224 to select (activate) and deselect (deactivate) corresponding subpixels for updating. Further, the emission control lines 223 are driven by emission control circuitry and control the brightness of the subpixels 26.

The display driver 208 includes display driver circuitry configured to drive the data lines 222 with subpixel data signals to update the selected subpixels electrodes 226 and update the display of the display device 200. For example, the display driver 208 may drive display update signals onto the data lines 222 during corresponding display updating periods.

The display driver 208 is configured to update the subpixel electrodes 226 to update an image displayed on the display panel 210 during display frames. The display frames may be updated, or refreshed, once about every 16 ms, generating a display refresh rate of about 60 Hz. In other embodiments, other display refresh rates may be employed. For example, the display refresh rate may be 90 Hz, 120 Hz, 140 Hz, or greater.

The display driver 208, the sensor circuitry 104, and the determination module 106 may be part of a common processing system (e.g., the processing system 211). Alternatively, the display driver 208 may be part of a first processing system and the sensor circuitry 104 and the determination module 106 may be part of a second processing system. Further, the display driver 208, the sensor circuitry 104, and the determination module 106 may be part of a common IC chip. Alternatively, one or more of the display driver 208, the sensor circuitry 104, and the determination module 106 may be disposed in a first IC chip and a second one or more of the display driver 208, the sensor circuitry 104, and the determination module 106 are disposed on a second IC chip.

In various embodiments, the sensor circuitry 104 is configured to drive the sensor electrodes for capacitive sensing during a capacitive frame at a capacitive frame rate. In one embodiment, during each capacitive frame each sensor electrode 105 is operated for absolute capacitive sensing. Further, each capacitive frame may include multiple periods during which different sensor electrodes 105 are operated for absolute capacitive sensing.

The "capacitive frame rate" (the rate at which successive capacitive images are acquired) may be the same or be different from that of the "display frame rate" (the rate at which the display image is updated, including refreshing the screen to redisplay the same image). In various embodiments, the capacitive frame rate is an integer multiple of the display frame rate. In other embodiments, the capacitive frame rate is a fractional multiple of the display frame rate. In yet further embodiments, the capacitive frame rate may be any fraction or multiple of the display frame rate. Further, the capacitive frame rate may be a rational fraction of the display rate (e.g., 1/2, 2/3, 1, 3/2, 2). In one or more embodiments, the display frame rate may change while the capacitive frame rate remains constant. In other embodiment, the display frame rate may remain constant while the capacitive frame rate is increased or decreased. Alternately, the capacitive frame rate may be unsynchronized from the display refresh rate or the capacitive frame rate may be a non-rational fraction of the display rate to minimize interference "beat frequencies" between the display updating and the input sensing.

In one or more embodiments, capacitive sensing (or input sensing) and display updating may occur during at least partially overlapping periods. For example, the sensor circuitry 104 is configured to operate the sensor electrodes 105 for capacitive sensing while the display driver 208 operates the gate lines 224 and data lines 222 to update an image displayed by the display panel 210. For example, updating the display panel 210 and operating the sensor electrodes 105 for capacitive sensing may be asynchronous with each other. Further, updating the display panel 210 and operating the sensor electrodes 105 for capacitive sensing may or may not be synchronized with each other.

In one or more embodiments, updating the display panel 210 and operating the sensor electrodes 105 for capacitive sensing may occur during non-overlapping periods. For example, updating the display panel 210 may occur during display update periods and operating the sensor electrodes 105 for capacitive sensing may occur during non-display update periods. The non-display update periods may be a blanking period that occurs between the last line of a display frame and the first line of the following display frame (e.g., during a vertical blanking period). Further, the non-display update periods may occur between display line update periods for two consecutive display lines of a display frame and are at least as long in time as the display line update period. In such embodiments, the non-display update period may be referred to as a long horizontal blanking period or long h-blanking period, where the blanking period occurs between two display line updating periods within a display frame and is at least as long as a display line update period.

Figure 3:
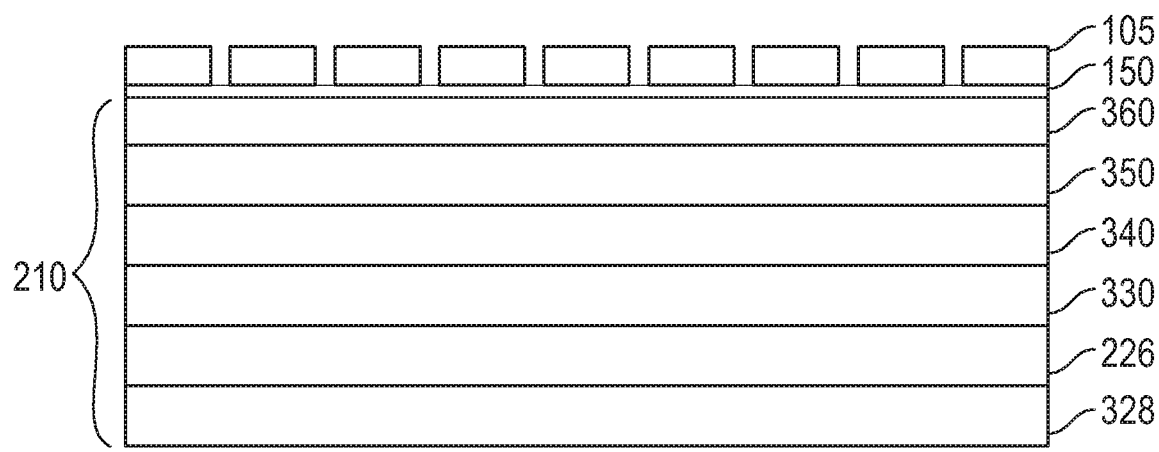
FIG. 3 is a schematic side view of an input device, according to one or more embodiments.

FIG. 3 illustrates a partial side view of the input device 100 and the display device 200, according to one or more embodiments. In the embodiment of FIG. 3, the display panel 210 is an organic light emitting diode (OLED) display panel. However, in other embodiments, other display types (e.g., liquid crystal displays (LCDs) or the like) may be utilized.

As illustrated, the display panel 210 includes a substrate 328, the subpixel electrodes 226, organic material layers 330, a cathode electrode 340, display layers 350, and an encapsulation layer 360. The cathode electrode 340 may be a sheet of resistive material configured to overlap the subpixel electrodes 226. The cathode electrode 340 may be coupled with and driven by the display driver 208 to supply a low impedance reference voltage. In embodiments where the display panel 210 is an LCD panel, the cathode electrode 340 is replaced with a common voltage (Vcom) electrode layer. Further, the cathode electrode 340 (or the Vcom electrode layer) may be referred to as a reference electrode layer.

The substrate 328 may be a flexible substrate. Alternatively, the substrate 328 may be rigid. The display layers 350 may include one or more polarizers and a color filter glass, among others. As illustrated, the sensor electrodes 105 are disposed on the encapsulation layer 360. In embodiments comprising a lens, the sensor electrodes 105 may be disposed on a lens instead of the encapsulation layer 360. The lens may be disposed over the encapsulation layer 360 or included instead of the encapsulation layer 360.

The traces 150 may be disposed in a layer between the sensor electrodes 105 and the display panel 210. Alternatively, the traces 150 may be disposed in a layer of the display panel 210 between the substrate 328 and the encapsulation layer 360.

As discussed above, as the sensor electrodes 105 are disposed over the display panel 210, the display electrodes of the display panel 210 undesirably capacitively couple with the sensor electrodes 105. This capacitive coupling maybe referred to as background capacitance and increases the capacitance of the sensor electrodes 105. Further, interference may be introduced into the sensor electrodes 105 via the background capacitance. However, by driving a portion of the sensor electrodes with guarding signals while driving another portion of the sensor electrodes for capacitive sensing, interference is mitigated. Further, by driving a second portion of the sensor electrodes with a reference signal or electrically floating the second portion of the sensor electrodes, the background capacitance is mitigated. Advantageously, the ease of detection of input objects is increased, while the power utilized to drive the sensor electrodes is decreased.

Figure 4:
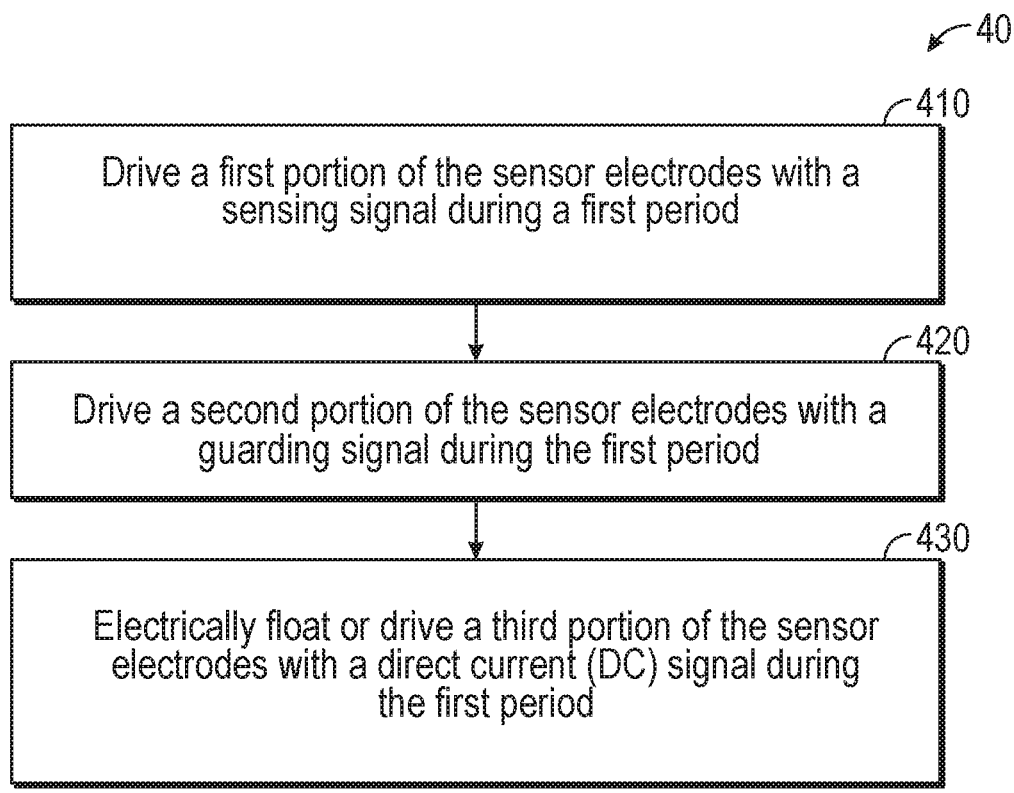
FIG. 4 is a flow chart of a method for performing capacitive sensing, according to one or more embodiments.

FIG. 4 is a flowchart of a method 400 for reducing the background capacitance and interference while performing capacitive sensing, according to one or more embodiments. The method 400 is described with reference to FIGS. 2 and 5. At operation 410, the sensor circuitry 104 drives a first portion of the sensor electrodes 105 with a sensing signal during a first period. The sensing signal may be an absolute capacitive sensing signal. Further, the sensor circuitry 104 acquires a corresponding resulting signal from each driven sensor electrode. For example, the sensor circuitry 104 drives each sensor electrode of the row 176 with an absolute capacitive sensing signal during a first period to acquire a corresponding resulting signal from each driven sensor electrode. The first period may correspond to a first part of a first capacitive frame. FIG. 5 illustrates a portion of the capacitive frame 500 (e.g., the first capacitive frame). As illustrated, the capacitive frame 500 includes at least three periods during which capacitive sensing is performed. For example, the capacitive frame 500 includes at least a first period, a second period, and a third period. In various embodiments, the capacitive frame 500 may include additional periods such that each of the sensor electrodes 105 are operated for absolute capacitive sensing before the completion of the capacitive frame. The additional periods may occur before the first period, after the third period and/or between the first, second, and third periods.

At operation 420, each sensor electrode of a second portion of sensor electrodes is driven with a guarding signal during the first period. For example, the sensor circuitry 104 drives each sensor electrode of the row 177 with a guarding signal during the first period. In this example, the row selected to acquire resulting signals (e.g., the row 176) is adjacent to the row that is guarded (e.g., the row 177). In various embodiments, during the first period, the display electrodes (e.g., the data lines 222, the gate lines 224, and the emission control lines 223) are operated for display updating. For example, in one embodiment, the display driver 208 drives the data lines 222 and the gate selection circuitry 230 drives the gate lines 224 to update the subpixel electrodes 226 during the first period.

In one or more embodiments, the sensor circuitry 104 driving the second portion of the sensor electrodes 105 with the guarding signal additionally includes driving the sensor electrodes of one or more of the rows 170-175 and 179-181 with the guarding signal during the first period. For example, the sensor electrodes of row 175 may be driven with a guarding signal during the first period. In such embodiments, the row selected to acquire resulting signals (e.g., the row 176) is between two rows that are guarded (e.g., the rows 174 and 177).

Guarding the sensor electrodes of the second portion adjacent to the first portion of the sensor electrodes operated for absolute capacitive sensing reduces the effects of display interference generated by operating the display electrodes for display updating. For example, driving the sensor electrodes of the row 177 with a guarding signal at least partially reduces the effects of the interference emitted by the display electrodes (e.g., the data lines 222, the gate lines 224 and/or the cathode electrode 340) driven for display updating on the sensor electrodes of the row 176. Reducing the effects of the interference emitted by driving the display electrodes for display updating reduces the effects of the interference in the resulting signals received with the sensor electrodes operated for absolute capacitive sensing. Accordingly, effects corresponding to an input object 140 makes up a larger portion of the resulting signal, thus increasing the ease of detection of the input object 140.

At operation 430, a third portion of the sensor electrodes 105 is electrically floated or driven with a DC signal during the first period. The third portion of the sensor electrodes 105 is adjacent to the second portion of the sensor electrodes and not the first portion of the sensor electrodes. The operation 430 may include driving each sensor electrode of a third row of sensor electrodes with a reference signal or electrically floating each sensor electrode of the third row of sensor electrodes during the first period. For example, in one embodiment, the sensor electrodes of the row 178 are driven with a reference signal by the sensor circuitry 104 during the first period. The sensor circuitry 104 additionally drives the sensor electrodes of one or more of the rows 170-175 and 179-181 with the reference signal during the first period. The reference signal may be a constant voltage signal. For example, the reference signal may be a DC signal. In another embodiment, at operation 430, the sensor circuitry 104 electrically floats the sensor electrodes of the row 178 during the first period. For example, the sensor circuitry 104 may be decoupled from the sensor electrodes of the row 178 during the first period such that the sensor electrodes are not actively driven by the sensor circuitry 104. Alternatively, the sensor circuitry 104 may place the sensor electrodes of the row 178 in a high impedance state. In one or more embodiments, the sensor circuitry 104 additionally electrically floats the sensor electrodes of one or more of the rows 170-175 and 179-181 during the first period. Driving the rows 170-175 and 179-181 of the sensor electrodes 105 with a reference voltage or electrically floating these rows reduces the background capacitance between the sensor electrodes 105 and the display electrodes of the display panel 210.

As illustrated in FIG. 5, during the first period, the sensor electrodes 105 of a first portion of the sensor electrodes 105 are driven with an absolute capacitive sensing signal for absolute capacitive sensing, a second portion of the sensor electrodes 105 is driven with the guarding signal, and a third portion of the sensor electrodes 105 is electrically floated or driven with a DC voltage. For example, each row 170-181 is either operated for absolute capacitive sensing, driven with a guarding signal, or driven with a reference signal or electrically floated. The number of the rows 170-181 operated for absolute capacitive sensing maybe greater than or less than two. For example, one or more of the rows 170-174 and 177-181 may be operated for absolute capacitive sensing. Alternatively, the rows 170-181 operated for absolute capacitive sensing may be adjacent to each other or spatially separated from each other. Further, the number of the rows 170-181 of the sensor electrodes 105 operated for absolute capacitive sensing is less than the total number of rows. In one embodiment, the number of the rows 170-181 of sensor electrodes driven with the guarding signal during the first period may be greater than or less than two. For example, one or more of the rows 170-173 and 178-181 may be additionally driven with a guarding signal. Further, the number of the rows 170-181 driven with the guarding signal is less than the total number of the rows 170-181 not operated for absolute capacitive sensing.

The first portion of the sensor electrodes 105 and the fifth and/or sixth portion of the sensor electrodes 105 include one or more sensor electrodes in common. The second portion of the sensor electrodes 105 and the sixth portion of the sensor electrodes include one or more sensor electrodes in common. The third portion of the sensor electrodes 105 and the sixth portion of the sensor electrodes 105 include one or more sensor electrodes in common.

With further reference to FIG. 5, during the second period, a fourth portion of the sensor electrodes 105 is driven with an absolute capacitive sensing signal for absolute capacitive sensing, a fifth portion of the sensor electrodes 105 is driven with the guarding signal, and a sixth portion of the sensor electrodes 105 is electrically floated or driven with a DC voltage. For example, one or more of the rows 177 and 178 are driven for capacitive sensing and at least the rows 176 and 179 are driven with guarding signals. The remaining rows are driven with a reference voltage or electrically floated. Further, during the third period, a seventh portion of the sensor electrodes 105 is driven with an absolute capacitive sensing signal for absolute capacitive sensing, an eighth portion of the sensor electrodes 105 is driven with the guarding signal, and a ninth portion of the sensor electrodes 105 is electrically floated or driven with a DC voltage. For example, during the third period one or more of the rows 179 and 180 are driven for capacitive sensing and at least the rows 178 and 181 are driven with guarding signals. Additionally, the remaining rows are driven with a reference voltage or electrically floated.

The fourth portion of the sensor electrodes 105 and the eighth and/or ninth portion of the sensor electrodes 105 include one or more sensor electrodes in common. The fifth portion of the sensor electrodes 105 and the ninth portion of the sensor electrodes include one or more sensor electrodes in common. The sixth portion of the sensor electrodes 105 and the ninth portion of the sensor electrodes 105 include one or more sensor electrodes in common.

Figure 6A:
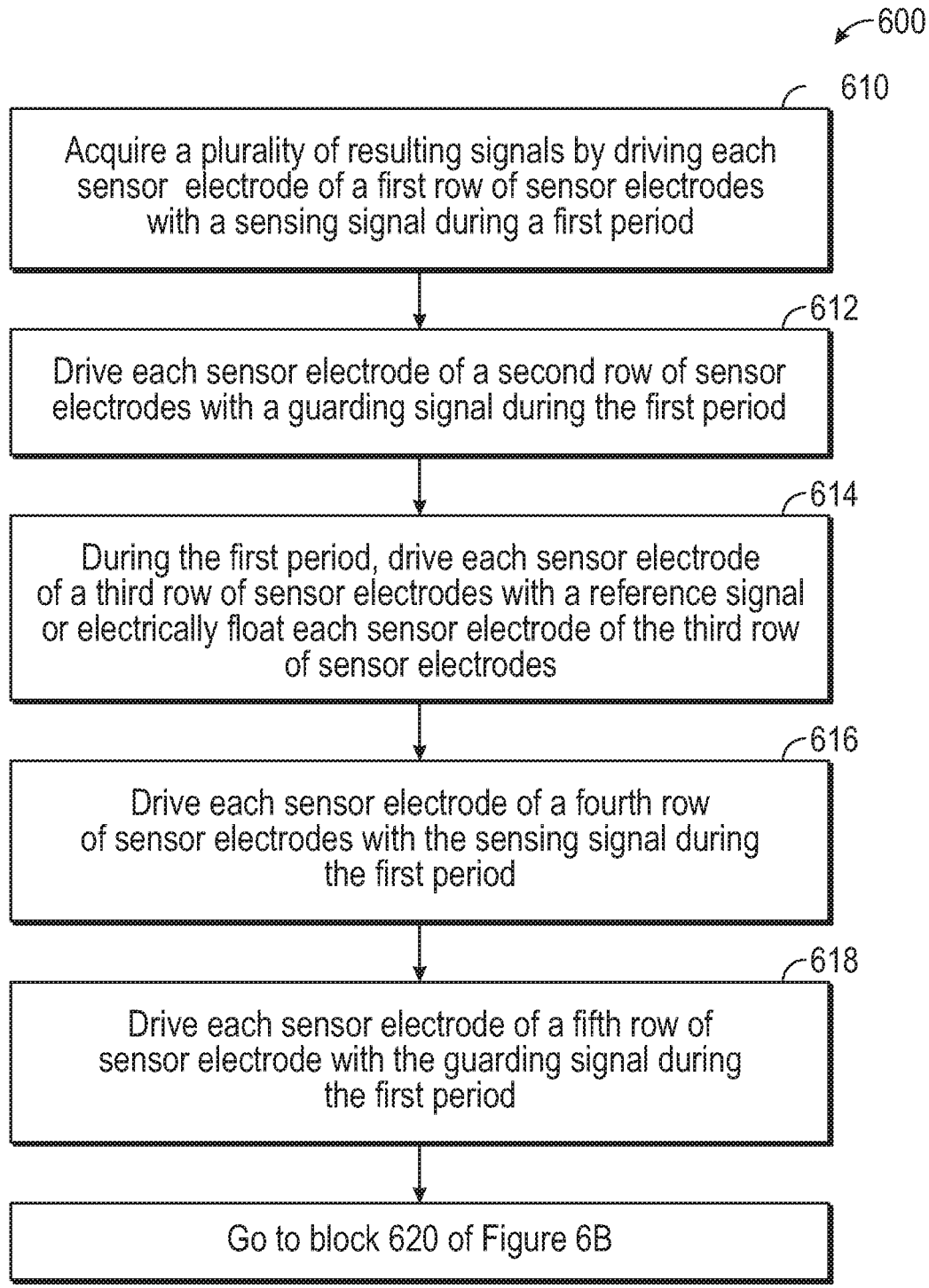
FIGS. 6A, 6B, and 6C illustrate a flow chart of a method for performing capacitive sensing, according to one or more embodiments.
Figure 6B:
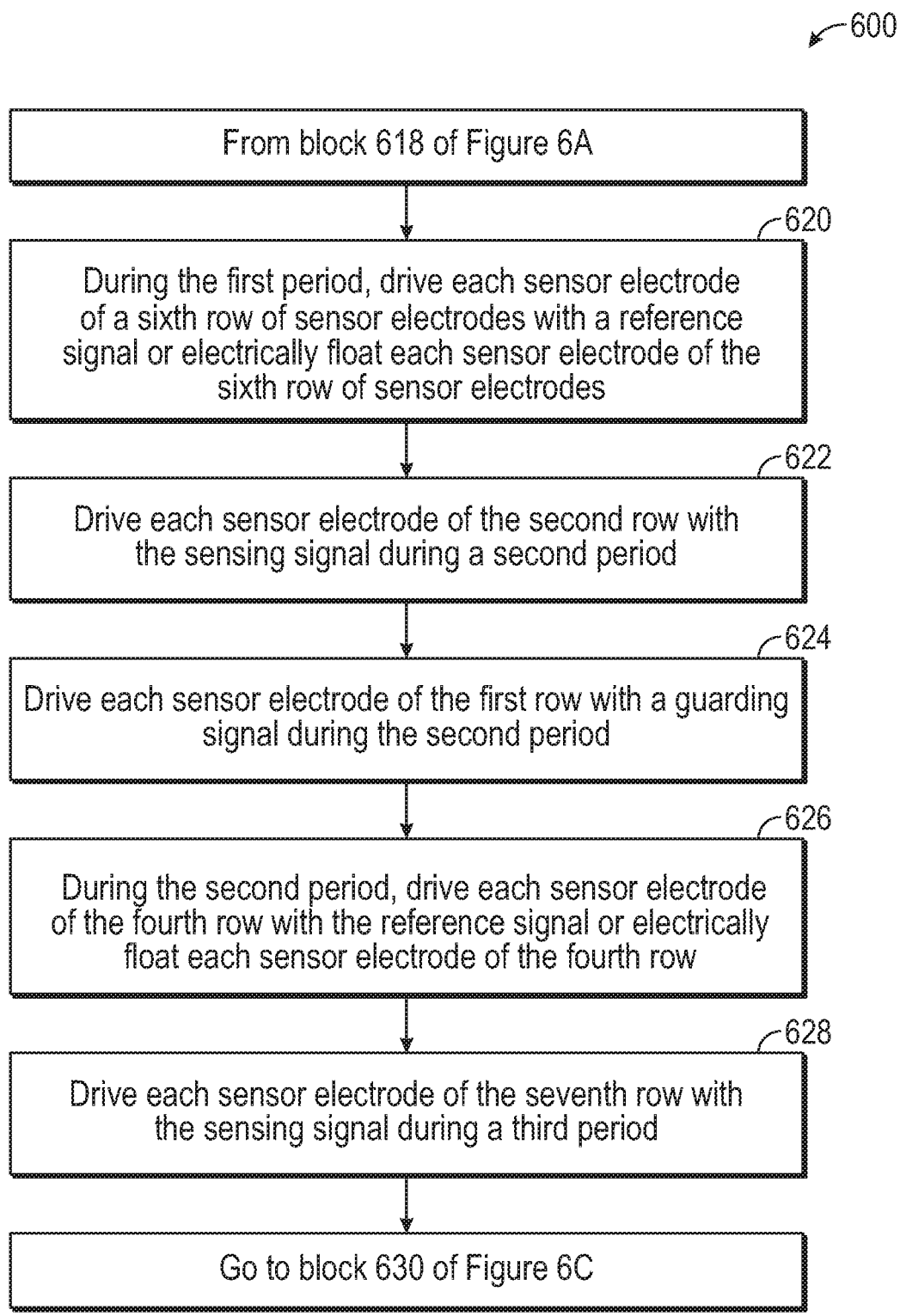
Figure 6C:
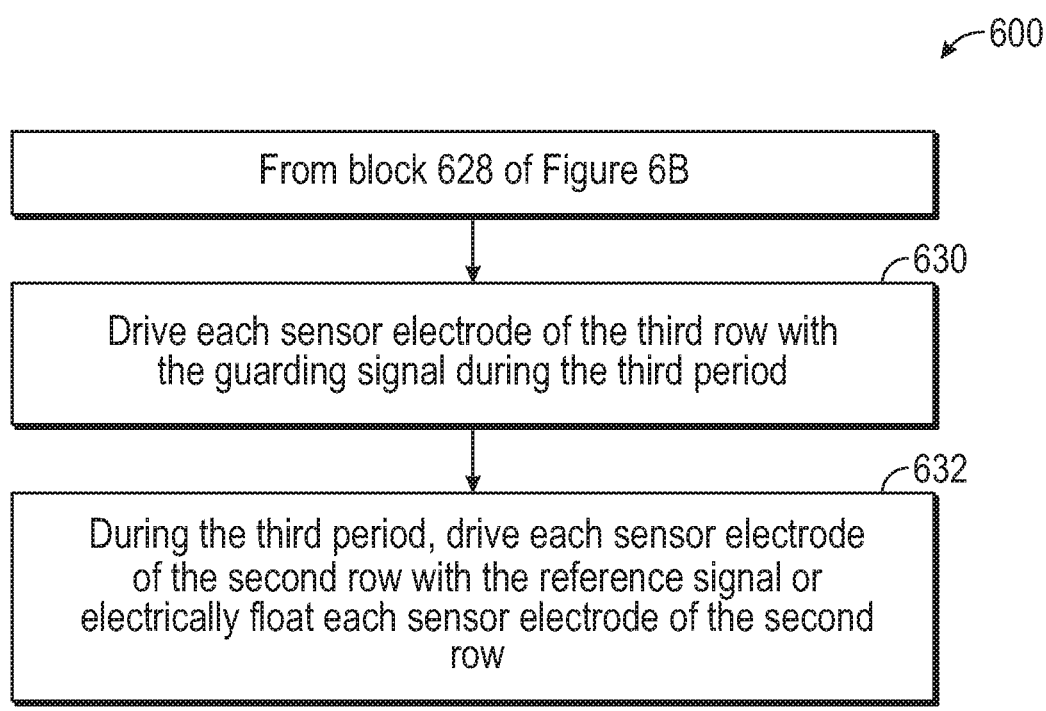

FIGS. 6A, 6B and 6C illustrate a flowchart of a method 600 for performing capacitive sensing, according to one or more embodiments. The method 600 is described with reference to FIG. 1 and FIG. 5. Further, operations 610, 612, and 614 of the method 600 are similar to the operations 410, 420, and 430 of the method 400 of FIG. 4. For example, at operation 610, the sensor circuitry 104 drives each sensor electrode of the row 176 with an absolute capacitive sensing signal to acquire a resulting signal from each driven sensor electrode during a first period of a first capacitive frame (e.g., the capacitive frame 500).

At operation 612, the sensor circuitry 104 drives each sensor electrode of the row 177 with a guarding signal during the first period. The row 177 is adjacent to the row 176.

At operation 614, the sensor circuitry 104 drives to a reference voltage or electrically floats the sensor electrodes of the row 178 during the first period. The row 178 is adjacent to the row 177 and the row 177 is between the row 176 and the row 178.

At operation 616, each sensor electrode of a fourth row of sensor electrodes is driven with a sensing signal during the first period. For example, the sensor circuitry 104 drives each sensor electrode of the row 175 with an absolute capacitive sensing signal during the first period to acquire a resulting signal from each driven sensor electrode. Driving the sensor electrodes of the rows 175 and 176 with an absolute capacitive sensing signal may at least partially overlap in time. Further, the sensor electrodes of the rows 175 and 176 are simultaneously driven with the absolute capacitive sensing signal by the sensor circuitry 104.

At operation 618, each sensor electrode of a fifth row of sensor electrodes is driven with a guarding signal during the first period. For example, the sensor circuitry 104 drives each sensor electrode of the row 174 with a guarding signal during the first period. Further, the row 174 is adjacent to the row 175.

At operation 620, each sensor electrode of a sixth row of sensor electrodes is driven with a reference signal or is electrically floated during the first period. For example, in one embodiment, during the first period, the sensor electrodes of the row 173 are driven with a reference signal by the sensor circuitry 104. In one or more embodiments, the sensor circuitry 104 additionally drives the sensor electrodes of one or more of the rows 170-172 and 179-181 with a reference signal. Alternatively, at operation 620, the sensor circuitry 104 electrically floats the sensor electrodes of the row 173 during the first period. In one or more embodiments, the sensor circuitry 104 additionally electrically floats the sensor electrodes of one or more of the rows 170-172 and 179-181.

At operation 622, each sensor electrode of the second row of sensor electrodes is driven with a sensing signal during a second period of the first capacitive frame. For example, the sensor circuitry 104 drives each sensor electrode of the row 177 with an absolute capacitive sensing signal during a second period of the first capacitive frame (e.g., the capacitive frame 500) to acquire a corresponding resulting signal from each driven sensor electrode. The second period corresponds to a second portion of the first capacitive frame and may be sequential with the first period.

At operation 624, the sensor circuitry 104 drives each sensor electrode of the row 176 with a guarding signal during the second period.

At operation 626, each sensor electrode of the fourth row of sensor electrodes is driven with the reference signal during the second period or each sensor electrode of the fourth row of sensors is electrically floated during the second period. In one embodiment, the sensor circuitry 104 drives the sensor electrodes of the row 175 with the reference signal during the second period. Alternatively, at operation 626, the sensor circuitry 104 electrically floats the sensor electrodes of the row 175.

Further, during the second period, the sensor circuitry 104 drives the sensor electrodes of the row 178 with the absolute capacitive sensing signal. Additionally, during the second period, the sensor circuitry 104 drives the sensor electrodes of the row 180 with the reference signal or the sensor circuitry 104 electrically floats the sensor electrodes of the row 180. The sensor circuitry 104 may also drive the sensor electrodes of the rows 170-174 and 181 with a reference signal period or electrically float the sensor electrodes of the rows 170-174 and 181 during the second period.

At operation 628, each sensor electrode of a seventh row is driven with a sensing signal during a third period of the first capacitive frame. For example, the sensor circuitry 104 drives the sensor electrodes of the row 179 with an absolute capacitive sensing signal during a third period to acquire resulting signals from the driven sensor electrodes of the row 179. The third period corresponds to a third portion of the first capacitive frame (e.g., the capacitive frame 500) and may be sequential with the second portion. Further, the first, second and third periods are non-overlapping with each other.

At operation 630, each sensor electrode of the third row is driven with the guarding signal during the third period. For example, the sensor circuitry 104 drives each sensor electrode of the row 178 with a guarding signal during the third period.

At operation 632, each sensor electrode of the second row is driven with the reference signal during the third period or each sensor electrode of the second row is electrically floated during the third period. For example, in one embodiment, each sensor electrode of the row 177 is driven with the reference signal or each electrode of the row 177 is electrically floated by the sensor circuitry 104 during the third period.

Additionally, the sensor circuitry 104 drives the sensor electrodes of the row 180 with the absolute capacitive sensing signal during the third period. Additionally, during the third period, the sensor circuitry 104 drives the sensor electrodes of the row 181 with a guarding signal. Further, during the third period, the sensor circuitry 104 drives each sensor electrode of the rows 170-177 with the reference signal. Alternatively, during the third period, the sensor circuitry 104 electrically floats each sensor electrode of the rows 170-177.

FIG. 7 illustrates the periods of a capacitive frame 700, according to one or more embodiments. As illustrated in FIG. 7, during a first period, the sensor circuitry 104 operates the rows 170-172 for absolute capacitive sensing. Further, during the first period, the sensor circuitry 104 drives a guarding signal onto the rows 173-174 and drives a reference signal or electrically floats the rows 175-181.

During the second period of FIG. 7, the sensor circuitry 104 operates the subsets of the rows 170-181 for absolute capacitive sensing, drives subsets of the rows 170-181 with a guarding signal and either drives subsets of the rows 170-181 with a reference voltage or electrically floats subsets of the rows 170-181 during the periods of the capacitive frame 700. For example, during the first period of the capacitive frame 700, the sensor circuitry 104 drives the sensor electrodes 105 of the rows 170-172 for absolute capacitive sensing and drives a guarding signal onto the sensor electrodes 105 of the rows 173-174. Further, during the first period, the sensor circuitry 104 drives a reference signal or electrically floats the sensor electrodes 105 of the rows 175-181.

During the second period of the capacitive frame 700, the sensor circuitry 104 drives the sensor electrodes 105 of the rows 173-175 for absolute capacitive sensing and drives a guarding signal onto the sensor electrodes 105 of the rows 171-172 and 176-177. Further, during the second period, the sensor circuitry 104 drives a reference signal or electrically floats the sensor electrodes 105 of the rows 170 and 178-181.

During the third period of FIG. 7, the sensor circuitry 104 operates the rows 176-178 for absolute capacitive sensing and drives a guarding signal onto the rows 174-175 and 179-180. Further, during the third period, the sensor circuitry 104 drives a reference signal or electrically floats the rows 170 and 178-181.

During the fourth period of FIG. 7, the sensor circuitry 104 operates the rows 179-181 for absolute capacitive sensing and drives a guarding signal onto the rows 177-181. Further, during the third period, the sensor circuitry 104 drives a reference signal or electrically floats the rows 176.

In other embodiments, the number or rows 170-181 driven for absolute capacitive sensing during each period of a capacitive frame may differ from that illustrated in FIG. 7. For example, while FIG. 7 illustrates that a subset of three rows is driven during each period for absolute capacitive sensing, in other embodiments, the subsets may include greater than three rows. Further, in a first one or more periods of a capacitive frame, the number of the rows of a subset may differ from the number of the rows of a subset in a second one or more periods of the capacitive frame. Further, the number of the rows in the subsets may vary from capacitive frame to capacitive frame.

In various embodiments, the ordering of the periods may differ from that illustrated in FIG. 7. For example, in one embodiment, the third period of the capacitive frame 700 may occur before the first period of the capacitive frame 700. In other embodiments, other orderings of the periods are possible. Further, each of the subset of the rows 170-181 may include a sequential grouping of the rows as illustrated in FIG. 7. In other embodiments, at least two of the rows 170-181 included in each subset are spatially separated from each other.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:

1. A method for operating sensor electrodes of an input device, the method comprising:
 performing, by the input device, capacitive sensing during a first period to obtain resulting signals from a first subset of the sensor electrodes, wherein performing the capacitive sensing during the first period comprises:
  driving, during the first period, the first subset of the sensor electrodes with a sensing signal, wherein the sensor electrodes are arranged in an array, wherein the first subset of the sensor electrodes comprises at least one line of sensor electrodes extending from one side of the array to an opposite side of the array;
  driving, during the first period, a second subset of the sensor electrodes with a guarding signal, wherein the second subset of the sensor electrodes comprises a first portion adjacent to the first border and a second portion adjacent to the second border, wherein the first portion of the second subset and the second portion of the second subset each comprises at least one line of sensor electrodes extending from one side of the array to the opposite side of the array, and wherein the guarding signal and the sensing signal have at least one of a common amplitude, a common phase, or a common frequency; and
 electrically floating or driving with a direct current (DC) signal a third subset of the sensor electrodes during the first period, wherein the third subset comprises a first portion is adjacent to the first portion of the second subset, wherein the third subset further comprises a second portion adjacent to the second portion of the second subset, wherein the first portion of the third subset is separated from the first subset by the first portion of the second subset, wherein the second portion of the third subset is separated from the first subset by the second portion of the second subset, and wherein the first portion of the third subset and the second portion of the third subset each comprises at least one line of sensor electrodes extending from one side of the array to the opposite side of the array.

2. The method of claim 1, further comprising:
 performing, by the input device, capacitive sensing during a second period to obtain resulting signals from a fourth subset of the sensor electrodes, wherein performing the capacitive sensing during the second period comprises:
  driving, during the second period, the fourth subset of the sensor electrodes with the sensing signal, wherein the fourth subset of the sensor electrodes corresponds to another plurality of sensor electrodes adjacent to one another and forming a portion of the array having at least a first border and a second border;
  driving, during the second period, a fifth subset of the sensor electrodes with the guarding signal, wherein the fifth subset of the sensor electrodes comprises a first portion adjacent to the first border of the fourth subset and a second portion adjacent to the second border of the fourth subset; and
  electrically floating or driving with the DC signal a sixth subset of the sensor electrodes during the second period, wherein the sixth subset comprises a first portion adjacent to the first portion of the fifth subset, wherein the sixth subset further comprises a second portion adjacent to the second portion of the fifth subset, wherein the first portion of the sixth subset is separated from the fourth subset by the first portion of the fifth subset, and wherein the second portion of the sixth subset is separated from the fourth subset by the second portion of the fifth subset.

3. The method of claim 2, wherein the first subset and the fifth subset include at least a first sensor electrode of the sensor electrodes in common, and wherein the second subset and the fourth subset include at least a second sensor electrode of the sensor electrodes in common.

4. The method of claim 1, wherein all sensor electrodes of the array other than the sensor electrodes of the first and second subsets are part of the third subset.

5. The method of claim 1, wherein the first subset comprises multiple lines, the first portion of the second subset contains only one line, and the second portion of the second subset contains only one line.

6. The method of claim 1, wherein the first subset comprises multiple lines, the first portion of the second subset comprises two or more lines, and the second portion of the second subset comprises two or more lines.

7. A processing system, comprising:
 sensor circuitry coupled to sensor electrodes, the sensor circuitry configured to:
  drive, during a first period, a first subset of the sensor electrodes with a sensing signal, wherein the sensor electrodes are arranged in an array, wherein the first subset of the sensor electrodes comprises at least one line of sensor electrodes extending from one side of the array to an opposite side of the array;
  drive, during the first period, a second subset of the sensor electrodes with a guarding signal, wherein the second subset of the sensor electrodes comprises a first portion adjacent to the first border and a second portion adjacent to the second border, wherein the first portion of the second subset and the second portion of the second subset each comprises at least one line of sensor electrodes extending from one side of the array to the opposite side of the array, and wherein the guarding signal and the sensing signal have at least one of a common amplitude, a common phase, or a common frequency; and
  electrically floating or driving with a direct current (DC) signal a third subset of the sensor electrodes during the first period, wherein the third subset comprises a first portion is adjacent to the first portion of the second subset, wherein the third subset further comprises a second portion adjacent to the second portion of the second subset, wherein the first portion of the third subset is separated from the first subset by the first portion of the second subset, wherein the second portion of the third subset is separated from the first subset by the second portion of the second subset, and wherein the first portion of the third subset and the second portion of the third subset each comprises at least one line of sensor electrodes extending from one side of the array to the opposite side of the array.

8. The processing system of claim 7, wherein the sensor circuitry is further configured to:
 drive, during a second period, a fourth subset of the sensor electrodes with the sensing signal, wherein the fourth subset of the sensor electrodes corresponds to another plurality of sensor electrodes adjacent to one another and forming a portion of the array having at least a first border and a second border;
 drive, during the second period, a fifth subset of the sensor electrodes with the guarding signal, wherein the fifth subset of the sensor electrodes comprises a first portion adjacent to the first border of the fourth subset and a second portion adjacent to the second border of the fourth subset; and electrically float or drive with the DC signal a sixth subset of the sensor electrodes during the second period, wherein the sixth subset comprises a first portion adjacent to the first portion of the fifth subset, wherein the sixth subset further comprises a second portion adjacent to the second portion of the fifth subset, wherein the first portion of the sixth subset is separated from the fourth subset by the first portion of the fifth subset, and wherein the second portion of the sixth subset is separated from the fourth subset by the second portion of the fifth subset.

9. The processing system of claim 8, wherein the first subset and the fifth subset include at least a first sensor electrode of the sensor electrodes in common, and wherein the second subset and the fourth subset include at least a second electrode of the sensor electrodes in common.

10. The processing system of claim 8, wherein all sensor electrodes of the array other than the sensor electrodes of the first and second subsets are part of the third subset.

11. The processing system of claim 8, wherein the first subset comprises multiple lines, the first portion of the second subset contains only one line, and the second portion of the second subset contains only one line.

12. The processing system of claim 8, wherein the first subset comprises multiple lines, the first portion of the second subset comprises two or more lines, and the second portion of the second subset comprises two or more lines.

13. An input device, comprising:
sensor electrodes; and
a processing system coupled to the sensor electrodes and configured to:
drive, during a first period, a first portion of the sensor electrodes with a sensing signal, wherein the sensor electrodes are arranged in an array, wherein the first subset of the sensor electrodes comprises at least one line of sensor electrodes extending from one side of the array to an opposite side of the array;
drive, during the first period, a second subset of the sensor electrodes with a guarding signal, wherein the second subset of the sensor electrodes comprises a first portion adjacent to the first border and a second portion adjacent to the second border, wherein the first portion of the second subset and the second portion of the second subset each comprises at least one line of sensor electrodes extending from one side of the array to the opposite side of the array, and wherein the guarding signal and the sensing signal have at least one of a common amplitude, a common phase, or a common frequency; and
electrically float or drive with a direct current (DC) signal a third subset of the sensor electrodes during the first period, wherein the third subset comprises a first portion is adjacent to the first portion of the second subset, wherein the third subset further comprises a second portion adjacent to the second portion of the second subset, wherein the first portion of the third subset is separated from the first subset by the first portion of the second subset, wherein the second portion of the third subset is separated from the first subset by the second portion of the second subset, and wherein the first portion of the third subset and the second portion of the third subset each comprises at least one line of sensor electrodes extending from one side of the array to the opposite side of the array.

14. The input device of claim 13, wherein the processing system is further configured to:
drive, during a second period, a fourth subset of the sensor electrodes with the sensing signal, wherein the fourth subset of the sensor electrodes corresponds to another plurality of sensor electrodes adjacent to one another and forming a portion of the array having at least a first border and a second border;
drive, during the second period, a fifth subset of the sensor electrodes with the guarding signal, wherein the fifth subset of the sensor electrodes comprises a first portion adjacent to the first border of the fourth subset and a second portion adjacent to the second border of the fourth subset; and
electrically float or drive with the DC signal a sixth subset of the sensor electrodes during the second period, wherein the sixth subset comprises a first portion adjacent to the first portion of the fifth subset, wherein the sixth subset further comprises a second portion adjacent to the second portion of the fifth subset, wherein the first portion of the sixth subset is separated from the fourth subset by the first portion of the fifth subset, and wherein the second portion of the sixth subset is separated from the fourth subset by the second portion of the fifth subset.

15. The input device of claim 13, further comprising:
an organic light emitting diode (OLED) display device;
wherein the processing system is further configured to update a display of the OLED display device during the first period.

16. The input device of claim 15, wherein the sensor electrodes are disposed on a first substrate, wherein the first substrate is a lens or an encapsulation layer of the OLED display device.

17. The input device of claim 13, wherein all sensor electrodes of the array other than the sensor electrodes of the first and second subsets are part of the third subset.

18. The input device of claim 13, wherein the first subset comprises multiple lines, the first portion of the second subset contains only one line, and the second portion of the second subset contains only one line.

19. The input device of claim 13, wherein the first subset comprises multiple lines, the first portion of the second subset comprises two or more lines, and the second portion of the second subset comprises two or more lines.

20. The input device of claim 13, further comprising:
a display panel having a plurality of display electrodes, wherein the plurality of display electrodes are disposed in a different layer from the sensor electrodes.

* * * * *

UNITED STATES PATENT AND TRADEMARK OFFICE
CERTIFICATE OF CORRECTION

PATENT NO. : 11,003,300 B1
APPLICATION NO. : 16/830147
DATED : May 11, 2021
INVENTOR(S) : Guozhong Shen Page 1 of 1

It is certified that error appears in the above-identified patent and that said Letters Patent is hereby corrected as shown below:

In the Claims

At Column 15: Line 10, Claim 1, after "array," please add:
--wherein the first subset of the sensor electrodes corresponds to a plurality of sensor electrodes adjacent to one another and forming a portion of the array having at least a first border and a second border, and--.

At Column 15: Line 14, Claim 1, for the paragraph beginning with "driving, during the first period," please correct the indentation to match the paragraph At Column 15: Line 8 beginning with "driving, during the first period.".

At Column 15: Line 26, Claim 1, for the paragraph beginning with "electrically floating or driving," please correct the indentation to match the paragraph At Column 15: Line 8 beginning with "driving, during the first period.".

At Column 16: Line 26, Claim 7, after "array," please add:
--wherein the first subset of the sensor electrodes corresponds to a plurality of sensor electrodes adjacent to one another and forming a portion of the array having at least a first border and a second border, and--.

At Column 17: Line 20, Claim 10, please correct the dependency from "claim 8" to --claim 7--.

At Column 17: Line 23, Claim 11, please correct the dependency from "claim 8" to --claim 7--.

At Column 17: Line 27, Claim 12, please correct the dependency from "claim 8" to --claim 7--.

At Column 17: Line 37, Claim 13, after "array," please add:
--wherein the first subset of the sensor electrodes corresponds to a plurality of sensor electrodes adjacent to one another and forming a portion of the array having at least a first border and a second border, and--.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*